United States Patent
Asai

(10) Patent No.: US 9,142,436 B2
(45) Date of Patent: Sep. 22, 2015

(54) STATISTICAL ANALYSIS METHOD AND SUBSTRATE PROCESS SYSTEM

(75) Inventor: Kazuhide Asai, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 898 days.

(21) Appl. No.: 13/175,132

(22) Filed: Jul. 1, 2011

(65) Prior Publication Data
US 2012/0010743 A1   Jan. 12, 2012

(30) Foreign Application Priority Data

Jul. 6, 2010  (JP) ................................ 2010-154251

(51) Int. Cl.
H01L 21/67 (2006.01)
H01L 21/677 (2006.01)

(52) U.S. Cl.
CPC .... H01L 21/67276 (2013.01); H01L 21/67775 (2013.01)

(58) Field of Classification Search
USPC ............... 700/29, 96, 108, 299, 300
See application file for complete search history.

(56) References Cited

U.S. PATENT DOCUMENTS 6,999,836 B2 * 2/2006 Schwarm et al. ............ 700/121
2009/0265027 A1 10/2009 Takahashi et al.

FOREIGN PATENT DOCUMENTS

| JP | 06-188405 A | 7/1994 |
| JP | 2004-186445 A | 7/2004 |
| JP | 2006-146459 A | 6/2006 |
| JP | 2006-294831 A | 10/2006 |
| WO | 2008/015880 A1 | 2/2008 |

* cited by examiner

Primary Examiner — Carlos Ortiz Rodriguez
(74) Attorney, Agent, or Firm — Volpe and Koenig, P.C.

(57) ABSTRACT

A data analyzing method includes receiving monitor data from the substrate processing apparatus; producing representative value data based on the monitor data; associating apparatus condition information indicating a condition of the substrate processing apparatus at the time of production of the monitor data, with the representative value data; storing the representative value data and the apparatus condition information associated with the representative value data and in a database; retrieving the representative value data and the apparatus condition information associated with the representative value data from the database; comparing an exclusion parameter with the retrieved apparatus condition information, the exclusion parameter including information indicating whether the retrieved representative value data should be included in analysis processing targets; and determining whether the retrieved representative value data should be included in the analysis processing targets, based on the comparison result.

6 Claims, 7 Drawing Sheets

| No | TITLE | APPARATUS CONDITION INFORMATION | EXCLUSION OPERATION |
|---|---|---|---|
| 1 | NF₃ GAS CLEANING | VALVE OF GAS SUPPLY SYSTEM FOR SUPPLYING NF₃ GAS IS OPENED AT LEAST ONCE DURING EXECUTION OF RECIPE | DO NOT ANALYZE |
| 2 | PUMP POWER SUPPLY | PUMP POWER SUPPLY IS TURNED OFF | DO NOT ANALYZE |
| 3 | TEMPERATURE CONDITION OF JACKET HEATER | TEMPERATURE OF PARTICULAR JACKET HEATER IS EQUAL TO OR LESS THAN 100 DEGREES | DO NOT ANALYZE |
| 4 | TEMPERATURE CONDITION INSIDE FURNACE | TEMPERATURE INSIDE FURNACE IS LOWER THAN THAT SET IN STANDBY MODE | DO NOT ANALYZE |
| 5 | NUMBER OF PRODUCT WAFERS | NUMBER OF PRODUCT WAFERS IS ZERO | DO NOT ANALYZE |
| 6 | RANGE OF ABNORMAL VALUE | RECEIVED MONITOR DATA VALUE IS TWICE OR GREATER THAN A REPRESENTATIVE DATA VALUE PRODUCED PREVIOUSLY | ANALYZE |
| 7 | MAINTENANCE INFORMATION | MAINTENANCE BUTTON PROVIDED IN THE APPARATUS IS PUSHED DOWN | DO NOT ANALYZE |
| 8 | APPARATUS ALARM | ALARM IS GENERATED FROM SPECIFIC APPARATUS | DO NOT ANALYZE |

FIG. 4

| No | TITLE | APPARATUS CONDITION INFORMATION | EXCLUSION OPERATION |
|---|---|---|---|
| 1 | NF₃ GAS CLEANING | VALVE OF GAS SUPPLY SYSTEM FOR SUPPLYING NF₃ GAS IS OPENED AT LEAST ONCE DURING EXECUTION OF RECIPE | DO NOT ANALYZE |
| 2 | PUMP POWER SUPPLY | PUMP POWER SUPPLY IS TURNED OFF | DO NOT ANALYZE |
| 3 | TEMPERATURE CONDITION OF JACKET HEATER | TEMPERATURE OF PARTICULAR JACKET HEATER IS EQUAL TO OR LESS THAN 100 DEGREES | DO NOT ANALYZE |
| 4 | TEMPERATURE CONDITION INSIDE FURNACE | TEMPERATURE INSIDE FURNACE IS LOWER THAN THAT SET IN STANDBY MODE | DO NOT ANALYZE |
| 5 | NUMBER OF PRODUCT WAFERS | NUMBER OF PRODUCT WAFERS IS ZERO | DO NOT ANALYZE |
| 6 | RANGE OF ABNORMAL VALUE | RECEIVED MONITOR DATA VALUE IS TWICE OR GREATER THAN A REPRESENTATIVE DATA VALUE PRODUCED PREVIOUSLY | ANALYZE |
| 7 | MAINTENANCE INFORMATION | MAINTENANCE BUTTON PROVIDED IN THE APPARATUS IS PUSHED DOWN | DO NOT ANALYZE |
| 8 | APPARATUS ALARM | ALARM IS GENERATED FROM SPECIFIC APPARATUS | DO NOT ANALYZE |

503t

STATISTICAL ANALYSIS METHOD AND SUBSTRATE PROCESS SYSTEM

CROSS-REFERENCE TO RELATED APPLICATIONS

This application is based upon and claims the benefit of priority from Japanese Patent Application No. 2010-154251, filed on Jul. 6, 2010, the entire contents of which are incorporated herein by reference.

TECHNICAL FIELD

The present disclosure relates to a statistical analysis method of analyzing monitor data provided from a substrate processing apparatus adapted to process a substrate, and a substrate processing system.

BACKGROUND

In a substrate processing apparatus which iteratively performs a substrate process (e.g., a batch process) according to a recipe, monitor data may be obtained at a number of locations or elements (e.g., a temperature sensor, a gas flow meter, a manometer or the like; hereinafter referred to as a "data generation location"). Such monitor data may include, e.g., time-series data including a temperature, a gas flow rate, a pressure or the like, which is representative of the progress of a substrate process or a condition of the substrate processing apparatus. In the related art, a group managing apparatus (i.e., a higher-level management device) has been utilized to collectively and efficiently manage a condition of a group of the substrate processing apparatus or the progress of the substrate process performed therein. Such a group managing apparatus collects monitor data provided from each substrate processing apparatus, which represents the progress of the substrate processes or the condition of the substrate processing apparatus, in a database (DB), and performs a predetermined analysis on the monitor data.

The group managing apparatus retrieves the monitor data stored in the database at a prescribed period (for example, a time interval between the start and end of a process defined in the recipe), produce representative value data (including an average, a maximum, a minimum, a standard variation, etc.) based on the retrieved monitor data, and store the produced representative value data in the database. Further, in the course of storing the currently produced representative value data in the database, the group managing apparatus may also retrieve any previously stored representative value data, which was produced under the same condition. In this case, the group managing apparatus may process the currently produced representative value data and the previously stored representative value data as population parameters and perform a statistical analysis on the population parameters.

However, if even one of improper value data is contained in the representative value data used as the population parameters, the group managing apparatus may generate unexpected analysis results, which leads to erroneous diagnosis of the operational reliability of the substrate processing apparatuses. For example, the group managing apparatus may collect monitor data generated by the substrate processing apparatuses even during a time period that is not subject to the statistical analysis, e.g., when a test run is performed on the substrate processing apparatuses in a production field, or when a maintenance work is performed on the substrate processing apparatus is performed. Further, the group managing apparatus may produce a representative value data (i.e., representative value data that should not be treated as targets for further statistical analysis) based on the collected monitor data and store them in the database as population parameters. In this situation, when statistical analysis is performed on such population parameters, it is difficult to evaluate accurately the operational reliability of the substrate processing apparatuses, which again leads to incorrect diagnosis results. In addition, such representative value data stored in the database may be retrieved for further analysis, which will adversely affect subsequent analysis results.

SUMMARY

The present disclosure provides some embodiments of a statistical analysis method and a substrate processing system which can filter out improper monitor data (e.g., data produced during a time period that is not subject to the statistical analysis), so that such data cannot be used for further analysis, thereby improving the accuracy of the statistical analysis.

According to one embodiment of the present disclosure, provided is a statistical analysis method comprising: receiving monitor data from a substrate processing apparatus configured to process a substrate; producing representative value data based on the monitor data; associating the representative value data with apparatus condition information indicating a condition of the substrate processing apparatus at the time of production of the monitor data; storing the representative value data and the apparatus condition information associated with the representative value data in a database; retrieving the representative value data and the apparatus condition information associated with the representative value data from the database; comparing exclusion parameters with the retrieved apparatus condition information, the exclusion parameters including information indicating whether representative value data associated with the apparatus condition information should be included in statistical analysis targets; and determining whether the retrieved representative value data is included in the statistical analysis targets, based on the comparison result.

According to another embodiment of the present disclosure, provided is a substrate processing system comprising: a substrate processing apparatus configured to process a substrate; and a group managing apparatus configured to communicate with the substrate processing apparatus, the group managing apparatus including: a communication unit configured to receive monitor data from the substrate processing apparatus; a monitor data receiving unit configured to receive the monitor data from the communication unit and further configured to store the received monitor data in a storing unit; a representative value producing unit configured to retrieve the monitor data stored in the storing unit, produce representative value data based on the monitor data, associate the representative value data with apparatus condition information indicating a condition of the substrate processing apparatus at the time of production of the monitor data, and store the representative value data and the apparatus condition information associated with the representative value data in the storing unit; and a determination unit configured to retrieve the representative value data and the apparatus condition information associated with the representative value data stored in the storing unit, compare exclusion parameters with the retrieved apparatus condition information, the exclusion parameters including information indicating whether representative value data associated with the apparatus condition information should be included in statistical analysis targets, and determine whether the retrieved representative value data is included in the statistical analysis targets, based on the comparison result.

BRIEF DESCRIPTION OF THE DRAWINGS

FIG. 4 is a table showing exclusion parameters associated with apparatus condition information according to one embodiment of the present disclosure.

DETAILED DESCRIPTION

In the following, a description will be made as to one embodiment of the present disclosure.

(1) Configuration of Substrate Processing System

Figure 1:
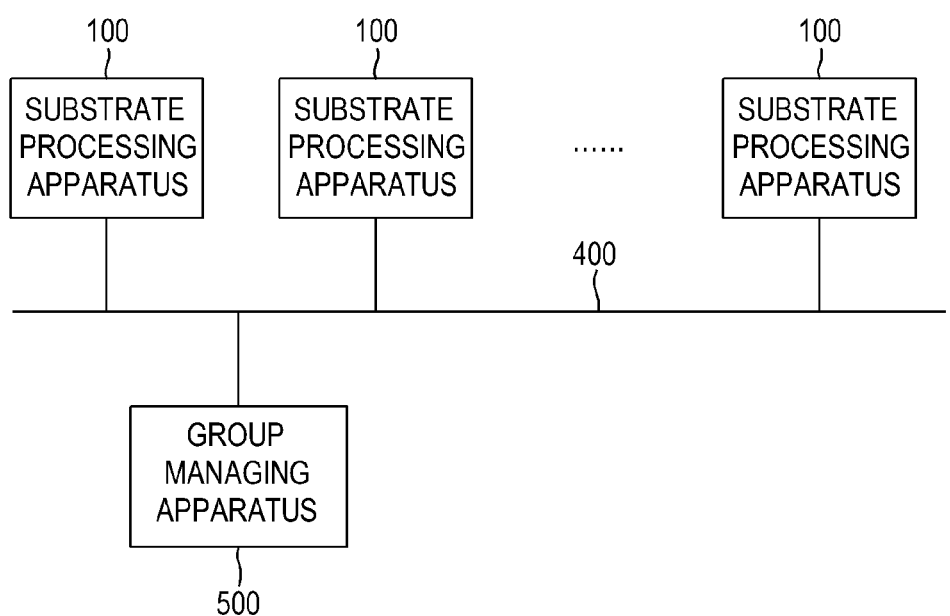
FIG. 1 is a schematic block diagram showing a configuration of a substrate processing system according to one embodiment of the present disclosure.

With reference to FIG. 1, a description will be made as to a configuration of a substrate processing apparatus according to one embodiment of the present disclosure. FIG. 1 is a schematic block diagram showing a configuration of a substrate process system according to one embodiment of the present disclosure.

As shown in FIG. 1, a substrate process system according to one embodiment of the present disclosure includes at least one substrate processing apparatus 100 configured to process a substrate according to a recipe defining processing sequences and conditions, and a group managing apparatus 500 connected to the substrate processing apparatus 100 so that the group managing apparatus 500 may exchange data with the substrate processing apparatus 100. The substrate processing apparatus 100 and the group managing apparatus 500 are connected to each other via a network 400 such as a local area network (LAN) or a wide area network (WAN).

(2) Configuration of Substrate Processing Apparatus

Figure 5:
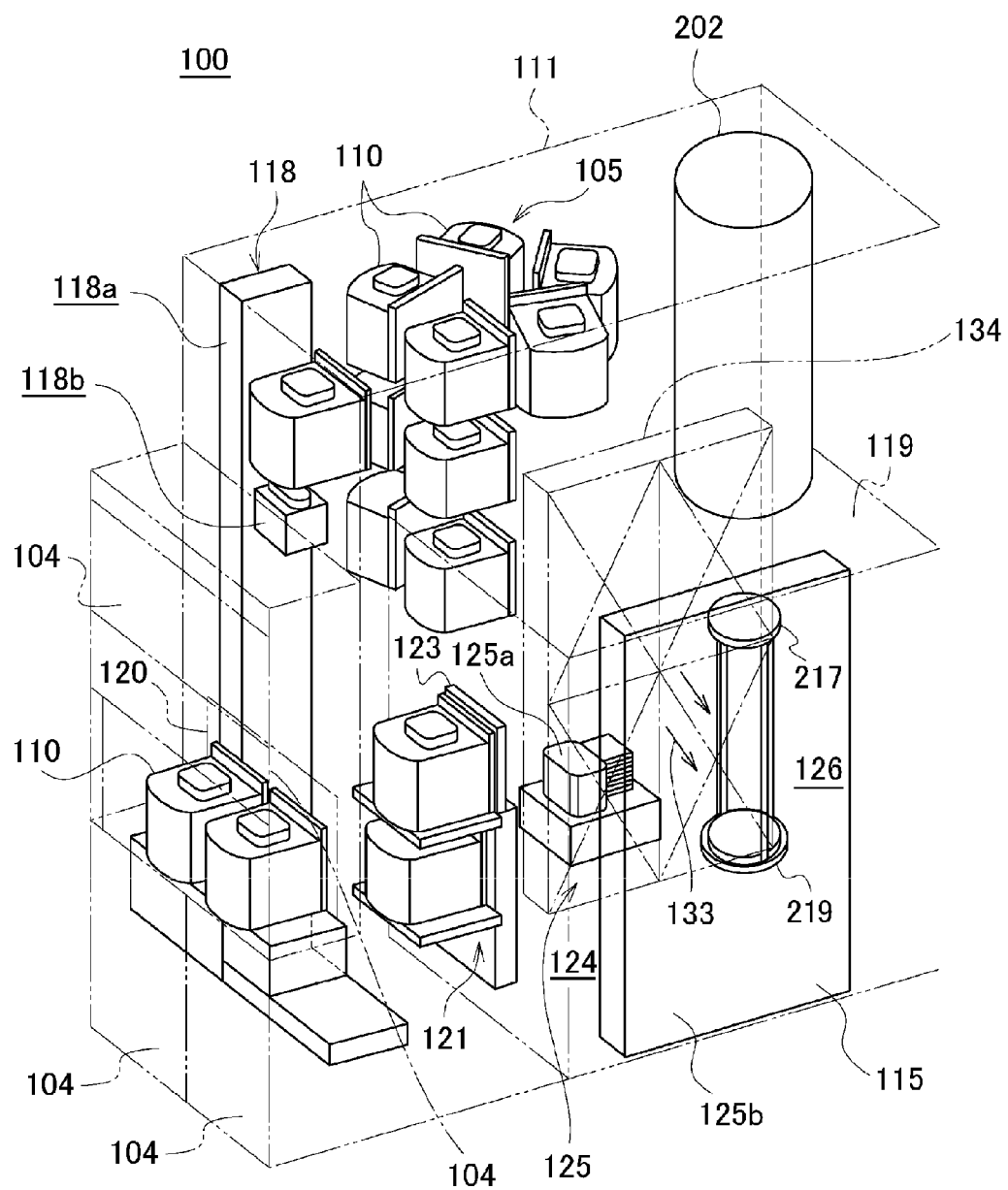
FIG. 5 is a perspective view of a substrate processing apparatus according to one embodiment of the present disclosure.
Figure 6:
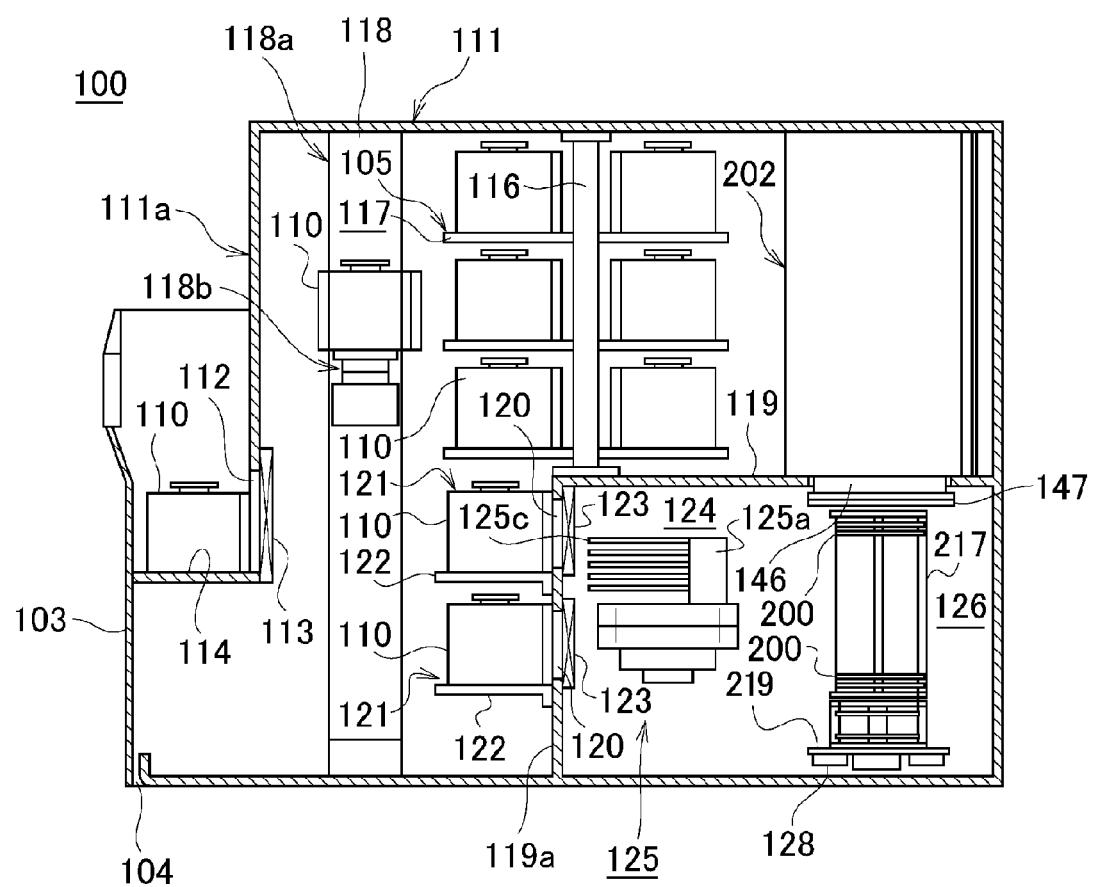
FIG. 6 is a side elevational view showing the substrate processing apparatus shown in FIG. 5.

Now, referring to FIGS. 5 and 6, a configuration of the substrate processing apparatus 100 according to the present disclosure will be described. FIG. 5 is a perspective view of the substrate processing apparatus according to one embodiment of the present disclosure. FIG. 6 is a side elevational view showing the substrate processing apparatus shown in FIG. 5. In the present embodiment, the substrate processing apparatus 100 is described as a vertical type equipment adapted to perform, for example, oxidation, diffusion and film-formation processes on a substrate such as a wafer.

As shown in FIGS. 5 and 6, the substrate processing apparatus 100 according to the present disclosure includes a housing 111 functioning as a pressure-tight case. Disposed in front of a front wall 111a of the housing 111 is a front maintenance gate 103 (used as an opening) through which maintenance work can be performed. A pair of front maintenance doors 104 for opening/closing the front maintenance gate 103 is formed in the front maintenance gate 103. A pod (used as a substrate container) 110 configured to accommodate therein a wafer (used as substrate) 200, e.g., made of silicon or the like is provided to be used as a wafer carrier for carrying the wafer 200 into/from the housing 111.

A pod carry-in/out gate (used as a substrate container carry-in/out gate) 112 is disposed in the front wall 111a of the housing 111 so that it is in communication with the inside of the housing 111. The pod carry-in/out gate 112 is configured to be opened or closed by means of a front shutter (used as an opening/closing mechanism for the substrate container carry-in/out gate) 113. A load port (used as a substrate container delivery stage) 114 is disposed in the front side of the pod carry-in/out gate 112. The pod 110 is placed and aligned on the load port 114. The pod 110 may be carried onto the load port 114 by means of a carrying device (not shown) during processing.

A rotary pod shelf (used as a shelf for loading substrate containers thereon) 105 is disposed in the upper side of an approximately central portion of the housing 111 in a horizontal longitudinal direction. The plurality of pods 110 is held on the rotary pod shelf 105. The rotary pod shelf 105 includes a column 116 vertically provided in the substrate processing apparatus 100 and configured to horizontally rotate in an intermittent manner, and a plurality of shelf boards (used as a board for loading substrate containers thereon) 117 which are supported by the column 116 in a radial direction thereof at upper, middle and lower stages of the column 116. The plurality of shelf boards 117 is configured to hold the plurality of pods 110 loaded thereon.

A pod carrier (used as a substrate container carrying device) 118 is disposed between the load port 114 and the rotary pod shelf 105 in the housing 111. The pod carrier 118 includes a boat elevator (used as a substrate container elevating mechanism) 118a configured to vertically move while holding the pod 110 loaded therein, and a pod carrying mechanism (used as a substrate container carrying mechanism) 118b configured to carry a pod loaded thereon. The pod carrier 118 carries the pod 110 between the load port 114, the rotary pod shelf 105 and pod openers (used as mechanisms for opening/closing a cover of a substrate container) 121 by means of subsequent actions of the boat elevator 118a and the pod carrying mechanism 118b.

At the lower side of the housing 111, a sub-housing 119 is provided extending from an approximately center portion to the rear end of the housing 111 in the horizontal longitudinal direction. A pair of wafer carry-in/out gates (used as substrate carry-in/out gates) 120, each of which is configured to carry a wafer 200 into/from the sub-housing 119, is vertically arranged in two stages. The pod openers 121 are disposed at the respective wafer carry-in/out gate 120, respectively.

Each of the pod openers 121 includes a pair of racks 122 for holding the pod 110 loaded thereon, and a cap attaching/detaching mechanism (used as a cover attaching/detaching mechanism) 123 for attaching/detaching a cap (e.g., cover) to/from the pod 110. The pod opener 121 detaches the cap of the pod 110 loaded on the rack 122 by means of the cap attaching/detaching mechanism 123 so that a wafer gateway of the pod 110 is opened/closed.

A transfer chamber 124 is formed in the sub-housing 119, the transfer chamber 124 being separated in a fluidic sense from a space where the pod carrier 118, the rotary pod shelf 105 or the like are disposed. A wafer transfer mechanism (used as a substrate transfer mechanism) 125 is provided in the front side within the transfer chamber 124. The wafer transfer mechanism 125 includes a wafer transfer device (used as a substrate transfer device) 125a configured to linearly move the wafer 200 without rotating in a horizontal direction, and an elevator (used as an elevator for moving vertically the substrate transfer device) 125b configured to elevate the wafer transfer device 125a. As shown in FIG. 5, the elevator 125b is mounted between one side (e.g., right side when viewed from the front side of the substrate processing apparatus 100) of the front portion of the transfer chamber 124 of the sub-housing 119 and the same side of the housing 111. The wafer transfer device 125a is equipped with a tweezer (used as a substrate loader) 125c configured to load the wafer 200 thereon. The elevator 125b and the wafer transfer device 125a may be subsequently operated so that the wafer 200 is charged and discharged into/from a boat (used as a substrate holder) 217.

A waiting station 126, which temporarily accommodates the boat 217 therein, is disposed at the rear side of the transfer chamber 124. A process furnace 202 functioning as a substrate processing unit is disposed above the waiting station 126. The bottom portion of the process furnace 202 is configured to be opened/closed by means of a furnace shutter (used as a furnace opening/closing mechanism) 147.

As shown in FIG. 5, a boat elevator 115 (used as a substrate holder elevating mechanism) configured to elevate the boat 217 is disposed between the right side of the waiting station 126 in the sub-housing 119 and the right side of the housing 111. An arm (used as a connecting part) 128 is mounted on an elevation board of the boat elevator 115. A sealing cap (used as a cover) 219 is horizontally disposed on the arm 128. The sealing cap 219 vertically supports the boat 217 and opens/closes the lower end of the boat 217.

The boat 217 includes a plurality of holding members. The boat 217 is configured to hold a plurality of wafers 200 (e.g., 50 to 125 wafers) so that they are horizontally stacked with their centers concentrically aligned.

As shown in FIG. 5, a clean unit 134 is disposed in the left side of the transfer chamber 124, opposite the side of the elevator 125b and the boat elevator 115. The clean unit 134 includes a supply fan and a dust-proof filter so as to supply clean air 133 such as filtered ambient or inert gas toward the elevator 125b and the boat elevator 115. A notch alignment device (not shown), which functions as a substrate alignment device for aligning the positions of the wafers in a circumferential direction, is disposed between the wafer transfer device 125a and the clean unit 134.

The clean air 133 generated by the clean unit 134 may flow through the circumference of the notch alignment device (not shown), the wafer transfer device 125a and the boat 217 disposed in the waiting station 126. Then, the air 133 may flow through a duct (not shown) to be exhausted out of the housing 111. Alternatively, the air 133 may be circulated toward a primary side (or a supply side) of the clean unit 13, being a suction side of the clean unit 134, so that the air 133 can be re-circulated throughout the transfer chamber 124.

(3) Operation of Substrate Processing Apparatus

In the following, the operation of the substrate processing apparatus 100 according to one embodiment of the present disclosure will be described with reference to FIGS. 5 and 6.

As shown in FIGS. 5 and 6, when the pod 110 is loaded on the load port 114, the pod carry-in/out gate 112 is opened by the front shutter 113. Subsequently, the pod 110 loaded on the load port 114 is carried from the pod carry-in/out gate 112 into the inside of the housing 111 by means of the pod carrier 118.

The pod 110 carried into the housing 111 is automatically carried on the shelf board 117 of the rotary pod shelf 105 by means of the pod carrier 118, so that it is temporarily held on the shelf board 117. Then, the pod 110 is transferred from the shelf board 117 to the rack 122 of one of the pod openers 121. Alternatively, the pod 110 carried into the housing 111 may be directly transferred on the rack 122 of the pod opener 121 by means of the pod carrier 118. At this time, the wafer carry-in/out gates 120 of the pod openers 121 are closed by means of the cap attaching/detaching mechanism 123. Also, the clean air 133 is being circulated through the transfer chamber 124 so that inside thereof is filled with the clean air 133. For example, the transfer chamber 124 is filled with nitrogen gas as the clean air 133 so that concentration of oxygen therein is equal to or less than, for example, 20 ppm, thereby allowing the concentration of oxygen inside of the transfer chamber 124 to be much lower than that which is inside of the housing 111 under normal atmospheric ambient conditions.

One surface of the pod 110 loaded on the rack 122 (e.g., the upper rack among the two racks shown in FIG. 6), is pushed against the opening side of the wafer carry-in/out gate 120 formed on a front wall 119a of the sub-housing 119. Then, the cap of the pod 110 is detached by means of the cap attaching/detaching mechanism 123 (e.g., the cap attaching/detaching mechanism of the upper rack) so that the wafer gateway of the pod 110 is opened. Thereafter, the wafers 200 loaded into the pod 110 are sequentially picked up by the tweezer 125c of the wafer transfer device 125a through the wafer gateway, and then an orientation of the picked-up wafers 200 is uniformly aligned by the notch alignment device. Subsequently, the picked-up wafers 200 are carried into the waiting station 126 disposed at the rear side of the transfer chamber 124, so that the wafers 200 are loaded (or charged) in the boat 217. After charging the picked-up wafers 200 in the boat 217, the wafer transfer device 125a turns back to another pod 110 and loads subsequent wafers 200 in the boat 217 in the same manner as described above.

That is, while the wafers 200 placed in one of the pod openers 121 (e.g., the pod opener 121 located at the upper stage) are being loaded into the boat 217 by the wafer transfer mechanism 125, another pod 110 is transferred onto the rack 122 of the other pod opener 121 (e.g., the pod opener 121 located at the lower stage) from the rotary pod shelf 105 by means of the pod carrier 118. In this way, the operation of opening the pod 110 by the pod opener121 is performed in parallel with the operation of the loading of the wafers 200 into the boat 217.

When a predetermined number of wafers 200 are loaded into the boat 217, the lower end of the process furnace 202 that has been closed by the furnace shutter 147 is opened by the furnace shutter 147. Subsequently, the sealing cap 219 is elevated by the boat elevator 115 so that the boat 217 including the wafers 200 loaded therein is carried (or loaded) into a process chamber 201 of the process furnace 202.

After loading, the wafers 200 are subjected to a predetermined process in the process chamber 201 of the process furnace 202. Thereafter, the boat 217 including the processed wafers 200 is carried out of the process chamber 201 and then the pod 110 loading the processed wafers 200 is carried out of the housing 111, which is performed in an approximately reverse order of the operation as described above, except that the wafers 200 are aligned by means of the notch alignment device 135.

(4) Configuration of Process Furnace

Figure 7:
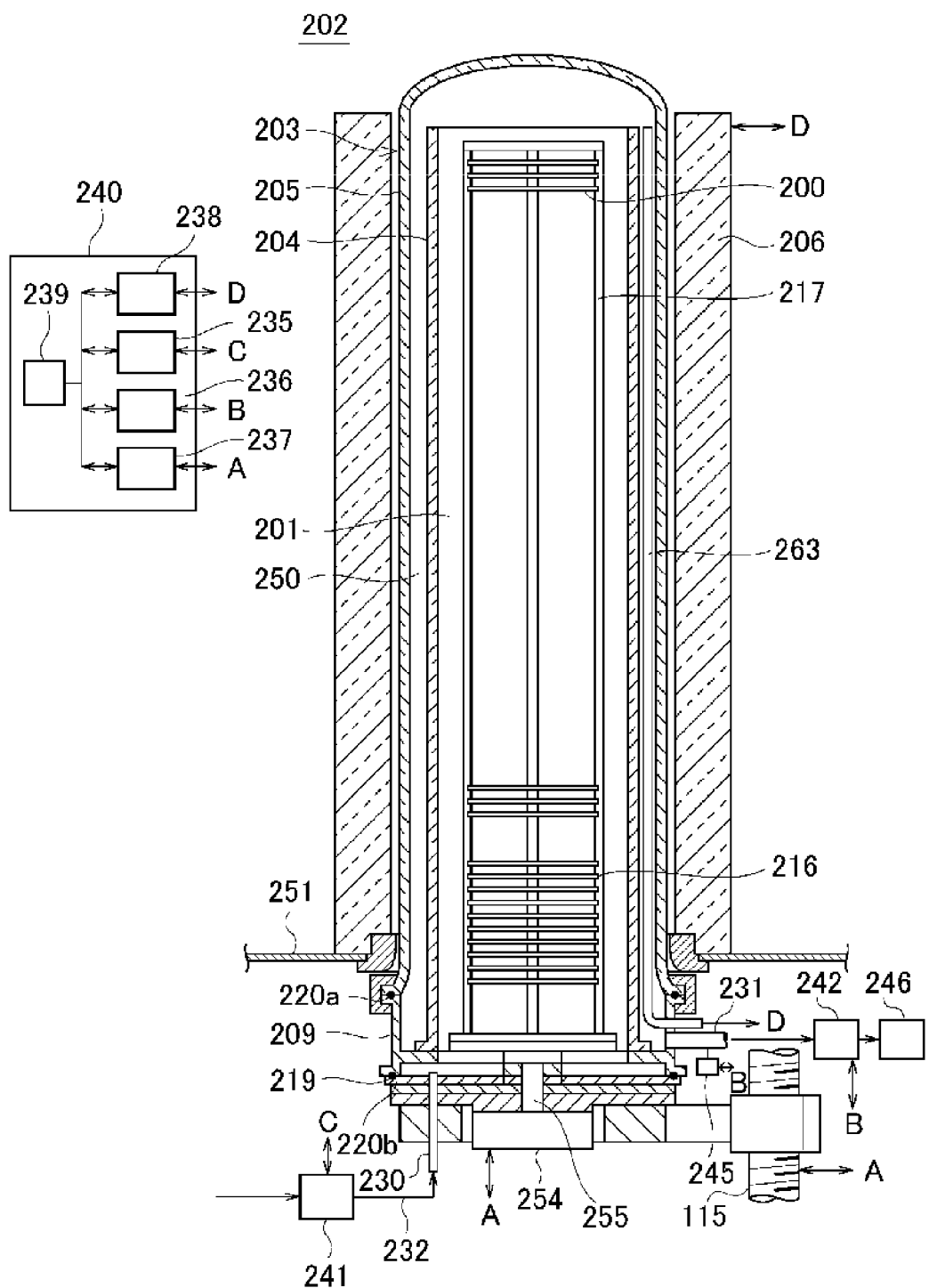
FIG. 7 is a vertical longitudinal section view of a process furnace included in the substrate processing apparatus according to one embodiment of the present disclosure.

The following is a description of a configuration of the process furnace 202 according to an embodiment of the present disclosure with reference to FIG. 7. FIG. 7 is a vertical longitudinal section view of the process furnace included in the substrate processing apparatus according to one embodiment of the present disclosure.

As shown in FIG. 7, the process furnace 202 includes a process tube 203 functioning as a reaction tube. The process tube 203 includes an inner tube 204 (used as an inner reaction tube), and an outer tube 205 (used as an outer reaction tube) which is mounted outside the inner tube 204. The inner tube 204 may be formed of a thermally-resistant material such as quartz ($SiO_2$), silicon carbide (SiC) or the like, and may be formed in a tubular shape that is opened at upper and lower ends. In a hollow portion of the inner tube 204, the process chamber 201 configured to process the wafers 200 (used as substrates) is formed. The outer tube 205 is formed concentrically with the inner tube 204. The internal diameter of the outer tube 205 is greater than the external diameter of the inner tube 204 and may be formed in a tubular shape that is closed at the upper end and open at the lower end. The outer tube 205 may be formed of a thermally-resistant material such as quartz, silicon carbide or the like.

Outside of the process tube 203, a jacket heater 206 (used as a heating mechanism) surrounds the circumference of the side wall of the process tube 203. The jacket heater 206 is formed in a tubular shape and is vertically arranged, being supported by a heater base 251 (used as a holding plate) (not shown).

Beneath the outer tube 205, a manifold 209 is disposed concentrically with the outer tube 205. The manifold 209 may be made of, for example, stainless steel or the like, and may be formed in a tubular shape that is open at upper and lower ends. The manifold 209 is engaged with the lower ends of the inner tube 204 and the outer tube 205 to support them. Further, an O-ring 220a (used as a seal member) is disposed between the manifold 209 and the outer tube 205. The manifold 209 is supported by the heater base 251 so that the process tube 203 is vertically arranged. The process tube 203 and the manifold 209 constitute a reaction container.

A nozzle 230 (used as a gas introducing part) is connected to a sealing cap 219 (which will be described later) so that it is in communication with the process chamber 201. A gas supply tube 232 is connected to the nozzle 230. A process gas supply source, an inert gas supply source, and a clean gas supply source configured to supply clean gas such as $NF_3$ gas (not shown) are connected an upstream portion of the gas supply tube 232 (i.e., at the side facing the side connected to the nozzle 230), via a plurality of valves (not shown) and a mass flow controller (MFC) 241 (which acts as a gas flow rate controller). The MFC 241 is electrically connected to a gas flow rate controlling unit 235. The gas flow rate controlling unit 235 is configured to control the MFC 241 to adjust the flow rates of the gases being supplied to the process chamber 201 to desired values at desired timing. The nozzle 230, the gas supply tube 232, the plurality of valves (not shown), the MFC 241, and each of the gas supply sources collectively constitute a gas supply system.

An exhaust tube 231 configured to evacuate atmosphere inside of the process chamber 201 is disposed on the manifold 209. The exhaust tube 231 is disposed at the lower end portion of a tubular space 250 that is formed by the gap between the inner tube 204 and the outer tube 205, so that the exhaust tube 231 communicates with the tubular space 250. A pressure sensor 245 (used as a manometer), a pressure adjusting equipment 242 configured to function as, for example, an APC (Auto Pressure Controller), and a vacuum exhaust equipment 246 such as a vacuum pump are sequentially connected to the downstream side of the exhaust tube 231 (which is opposite the side connected to the manifold 209). A pressure control part 236 is electrically connected to the pressure adjusting equipment 242 and the pressure sensor 245. The pressure control part 236 is configured to control the pressure adjusting equipment 242 at a desired timing to adjust the pressure in the process chamber 201 to be maintained at a desired pressure, based on pressure information detected by the pressure sensor 245.

The sealing cap 219 is disposed beneath the manifold 209 to be used as a furnace opening cover that air-tightly seals the lower end opening of the manifold 209. The sealing cap 219 abuts on the lower end of the manifold 209 at its top face in the vertical direction. The sealing cap 219 may be made of a metallic material such as stainless or the like, and may be disc-shaped. An O-ring 220b used as a sealing member is disposed on the upper surface of the sealing cap 219, abutting on the lower end of the manifold 209 at its top face. A rotating mechanism 254 configured to rotate the boat 217 is mounted in the vicinity of the center of the sealing cap 219, which is located opposite the process chamber 201. A rotating shaft 255 of the rotating mechanism 254 penetrates through the sealing cap 219 and vertically supports the boat 217. Rotation of the rotating shaft 255 of the rotating mechanism 254 enables rotation of the boat 217, thereby rotating the wafers 200. The sealing cap 219 may be elevated by means of the boat elevator 115 (used as an elevating mechanism) that is vertically disposed outside the process tube 203. The elevation of the sealing cap 219 allows the boat 217 to be transferred into or out of the process chamber 201. A carry control unit 238 is electrically connected to the rotating mechanism 254 and the boat elevator 115. The carry control unit 238 controls the rotating mechanism 254 and the boat elevator 115 to perform desired operations at a desired timing.

As described above, the boat 217 (used as a substrate holder) is configured to hold the plurality of wafers 200 so that they are horizontally stacked and concentrically aligned. The boat 217 is made of a thermally-resistant material such as quartz, silicon carbide or the like. A plurality of adiabatic plates 216 (used as thermally-resistant members) of a circular disk shape, which may be made of a thermally-resistant material such as quartz, silicon carbide, or the like, are horizontally stacked at the lower portion of the boat 217. The plurality of adiabatic plates 216 function to reduce the transfer of the heat generated from the jacket heater 206 to the manifold 209

A temperature sensor 263 used as a temperature detector is provided inside the process tube 203. A temperature control part 237 is electrically connected to the jacket heater 206 and the temperature sensor 263. The temperature control part 237 is configured to adjust the electric power supplied to the jacket heater 206 based on temperature information detected by the temperature sensor 263, so that the inside of the process chamber 201 has a desired temperature distribution at a desired time.

The gas flow rate control part 235, the pressure control part 236, the carry control unit 238 and the temperature control part 237 are electrically connected to a display device control unit 239 that controls the entire operation of the substrate processing apparatus 100. Hereinafter, the gas flow rate control part 235, the pressure control part 236, the carry control unit 238 and the temperature control part 237 are collectively referred to as "I/O control unit." The gas flow rate control part 235, the pressure control part 236, the carry control unit 238, the temperature control part 237 and the display device control unit 239 constitute a controller for controlling substrate processing apparatus 240 (hereinafter referred to as "controller 240"). The configuration and the operation of the controller 240 will be described later.

(5) Operation of Process Furnace

As one process of manufacturing a semiconductor device, a method for forming a thin film on the wafer 200 by CVD (Chemical Vapor Deposition) using the process furnace 202 with the afore-mentioned configuration will be described with reference to FIG. 7. In the following discussion, it should be noted that operations of respective parts constituting the substrate processing apparatus 100 are controlled by the controller 240.

When a plurality of wafers 200 are loaded into the boat 217 (in a wafer charging operation), as shown in FIG. 7, the boat 217 holding the plurality of wafers 200 is elevated by the boat elevator 115 to be carried into the process chamber 201 (in a boat loading operation). In this state, the sealing cap 219 seals the lower end of the manifold 209 via the O-ring 220b.

The inside of the process chamber 201 is evacuated by means of the vacuum exhaust equipment 246 so that the pressure therein is maintained at a desired pressure (i.e., at a desired degree of vacuum). At this time, an opening of a valve mounted in the pressure adjusting equipment 242 is feedback controlled based on pressure data measured by the pressure sensor 245. Further, the inside of the process chamber 201 is heated by the jacket heater 206 so that the temperature therein is maintained at a desired temperature. In this case, the temperature sensor 263 measures the temperature inside the process chamber 201, which is fed back to the jacket heater 206 so that it adjusts the electric power supplied thereto. Subsequently, the boat 217 is rotated by the rotating mechanism 254, which causes the wafers 200 to rotate.

Thereafter, a process gas is supplied from the process gas supply source to the MFC 241, where the flow rate of the process gas is controlled to be maintained at a desired level. The so-controlled gas is fed into the process chamber 201 from the nozzle 230 through the gas supply tube 232. Then, the gas introduced into the process chamber 201 flows upward within the process chamber 201 and subsequently flows from the upper end opening of the inner tube 204 into the tubular space 250, which is in turn exhausted through the exhaust tube 231. When the process gas passes through the inside of the process chamber 201, the process gas is in contact with the surface of the wafers 200. This causes a thermal CVD reaction that allows for the deposition of thin films on the wafers 200.

After a lapse of a predetermined period of process time, the inert gas is supplied from the inert gas supply source to the process chamber 201. Then, the atmosphere inside of the process chamber 201 is substituted with the inert gas, which causes the pressure therein to be returned to atmospheric pressure.

Thereafter, the sealing cap 219 is lowered by the boat elevator 115 so that the lower end of the manifold 209 is opened. Then, the processed wafers 200 held by the boat 217 are carried out of the lower end of the manifold 209 to the outside of the process tube 203 (in a boat unloading operation). Afterwards, the processed wafers 200 are discharged out of the boat 217 and are then loaded into the pod 110 (in a wafer discharging operation).

(6) Configuration of Controller for Substrate Processing Apparatus

Figure 2:
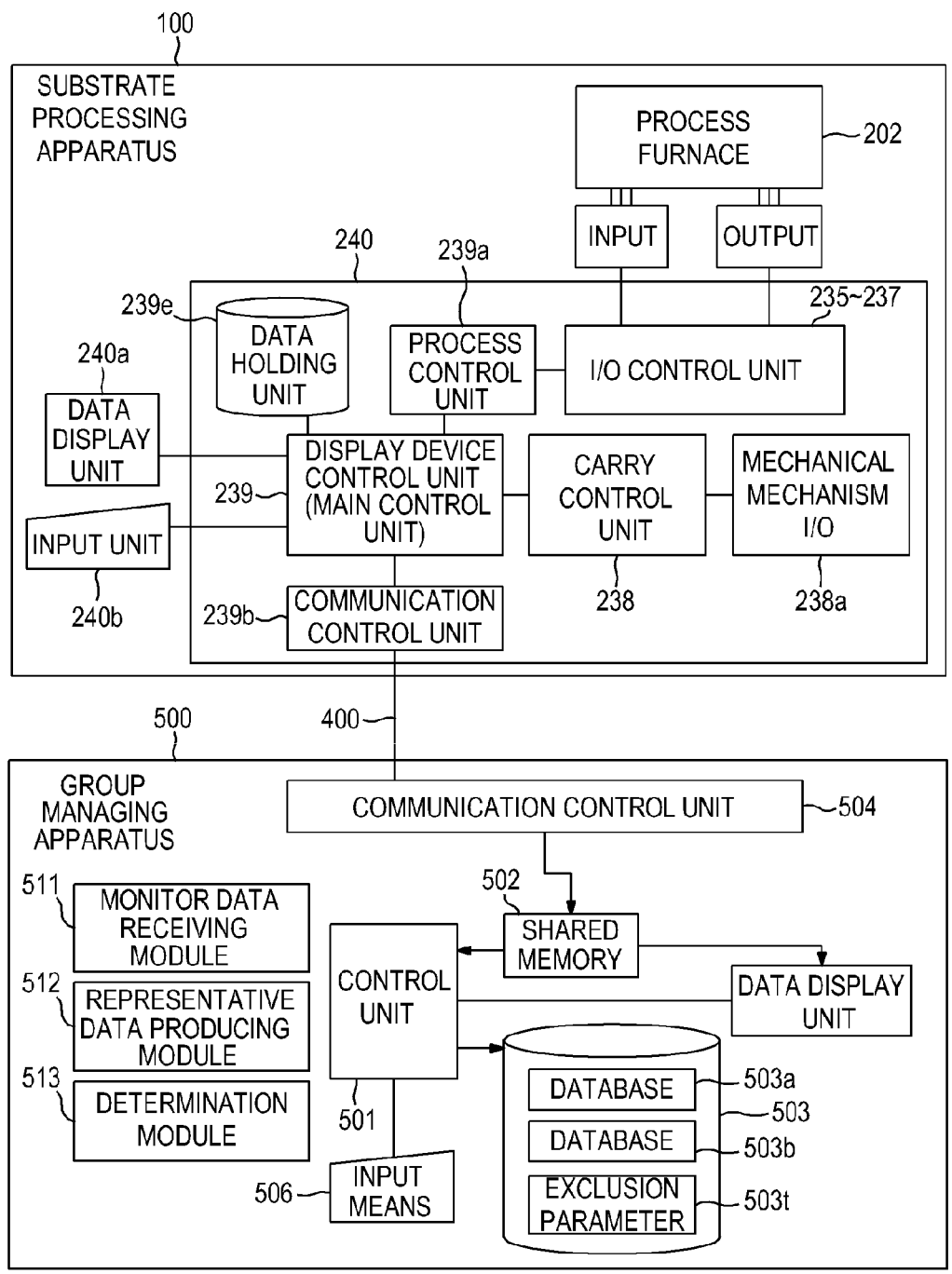
FIG. 2 is a block diagram showing configurations of a substrate processing apparatus and a group managing apparatus according to one embodiment of the present disclosure.

The following is a description of a configuration of the controller 240 according to one embodiment of the present disclosure with reference to FIG. 2. FIG. 2 is a block diagram showing a substrate processing apparatus and a group managing apparatus according to one embodiment of the present disclosure.

The controller 240 includes the afore-mentioned I/O control unit for controlling the process furnace 202 (which includes the gas flow rate control part 235, the pressure control part 236, the carry control unit 238 and the temperature control part 237), and a process control unit 239a connected to exchange data with the I/O control unit. The process control unit 239a is configured to control the operation of the process furnace 202 through the I/O control unit and is also configured to collect (or retrieve) data indicative of conditions (e.g., a temperature, a gas flow rate, a pressure, etc.) of the process furnace 202.

The controller 240 includes a display device control unit (used as an operating unit) 239 functioning as a main control unit that is connected to exchange data with the process control unit 239a. A data display unit 240a such as a display and an input unit 240b such as a keyboard are connected to the display device control unit 239. The display device control unit 239 is configured to receive input data (e.g., operation commands) provided from the input unit 240b by an operator, and is also configured to control the data display unit 240a to display a screen image indicative of conditions of the substrate processing apparatus 100 or an interface for receiving operation commands.

Further, the controller 240 includes a carry control unit 238 that is connected to exchange data with the display device control unit 239 and a mechanical mechanism I/O 238a that is connected to exchange data with the carry control unit 238. The mechanical mechanism I/O 238a is connected to respective parts (e.g., the pod elevator 118a, the pod carrying mechanism 118b, the pod opener 121, the wafer transfer mechanism 125, the boat elevator 115 or the like) which constitute the substrate processing apparatus 100. The carry control unit 238 is configured to control the operation of the respective parts constituting the substrate processing apparatus 100 through the mechanical mechanism I/O 238a, and is also configured to collect (or retrieve) data indicative of conditions (e.g., a position, an opening/closing state, an operation or a standby mode, or the like) of the respective parts constituting the substrate processing apparatus 100.

Further, the controller 240 includes a data holding unit 239e connected to the display device control unit 239. The data holding unit 239e is configured to hold (or store) operation programs to be executed by the controller 240 for implementing various functions, setting data (e.g., recipe data) associated with substrate process procedures to be performed at the process furnace 202, and various data retrieved from the I/O control unit (including the gas flow rate control part 235, the pressure control part 236, and the temperature control part 237) or the carry control unit 238.

Further, the controller 240 includes a communication control unit 239b connected to the display device control unit 239. Although not shown in FIG. 2, the I/O control unit (including the gas flow rate controlling unit 235, the pressure control part 236, and the temperature control part 237) or the carry control unit 238 may be directly connected to exchange data with the communication control unit 239b without involving therebetween the process control unit 239a or the display device control unit 239. Further, the communication control unit 239b is connected to exchange data with the group managing apparatus 500 (which will be described later) through a network 400.

The communication control unit 239b is configured to receive monitor data indicative of conditions (e.g., a temperature, a gas flow rate, a pressure, etc.) of the process furnace 202 which is retrieved from the I/O control unit (including the gas flow rate controlling unit 235, the pressure control part 236 and the temperature control part 237) through the process control unit 239a and the display device control unit 239, and transmit the received monitor data to the group managing apparatus 500. In addition, the communication control unit 239b is configured to receive monitor data (which is retrieved through the mechanical mechanism I/O 238a) indicative of conditions (e.g., a position, an opening/closing state, an operation or a standby mode, or the like) of the respective parts constituting the substrate processing apparatus 100 through the carry control unit 238 and the display device control unit 239, and transmit the received monitor data to the group managing apparatus 500.

In addition, the communication control unit 239b may directly receive the monitor data indicative of conditions (e.g., a temperature, a gas flow rate, a pressure, etc.) of the process furnace 202 which is retrieved through the I/O control unit, without involving therebetween the process control unit 239a and the display device control unit 239, and transmit the received monitor data to the group managing apparatus 500. Further, the communication control unit 239b may directly receive the monitor data (which is retrieved through the mechanical mechanism I/O 238a) indicative of states (e.g., a position, an opening/closing state, an operation or a standby mode, or the like) of the respective parts constituting the substrate processing apparatus 100, without involving therebetween the display device control unit 239, and transmit the received monitor data to the group managing apparatus 500.

Although not shown in FIG. 2, the afore-mentioned I/O control unit (including the gas flow rate controlling unit 235, the pressure control part 236, and the temperature control part 237) and the carry control unit 238 may directly exchange data with the group managing apparatus 500 without involving therebetween the process control unit 239a, the display device control unit 239 and the communication control unit 239b. Further, the I/O control unit may receive the monitor data indicative of conditions (e.g., a temperature, a gas flow rate, a pressure, etc.) of the process furnace 202 and transmit the received monitor data directly to the group managing apparatus 500, without involving therebetween the process control unit 239a, the display device control unit 239 and the communication control unit 239b. Further, the mechanical mechanism I/O 238a may receive the monitor data indicative of conditions (e.g., a position, an opening/closing state, an operation or a standby mode, or the like) of the respective parts constituting the substrate processing apparatus 100 and transmit the received monitor data directly to the group managing apparatus 500 without involving therebetween the display device control unit 239 and the communication control unit 239b.

(7) Configuration of Group Managing Apparatus

Figure 3:
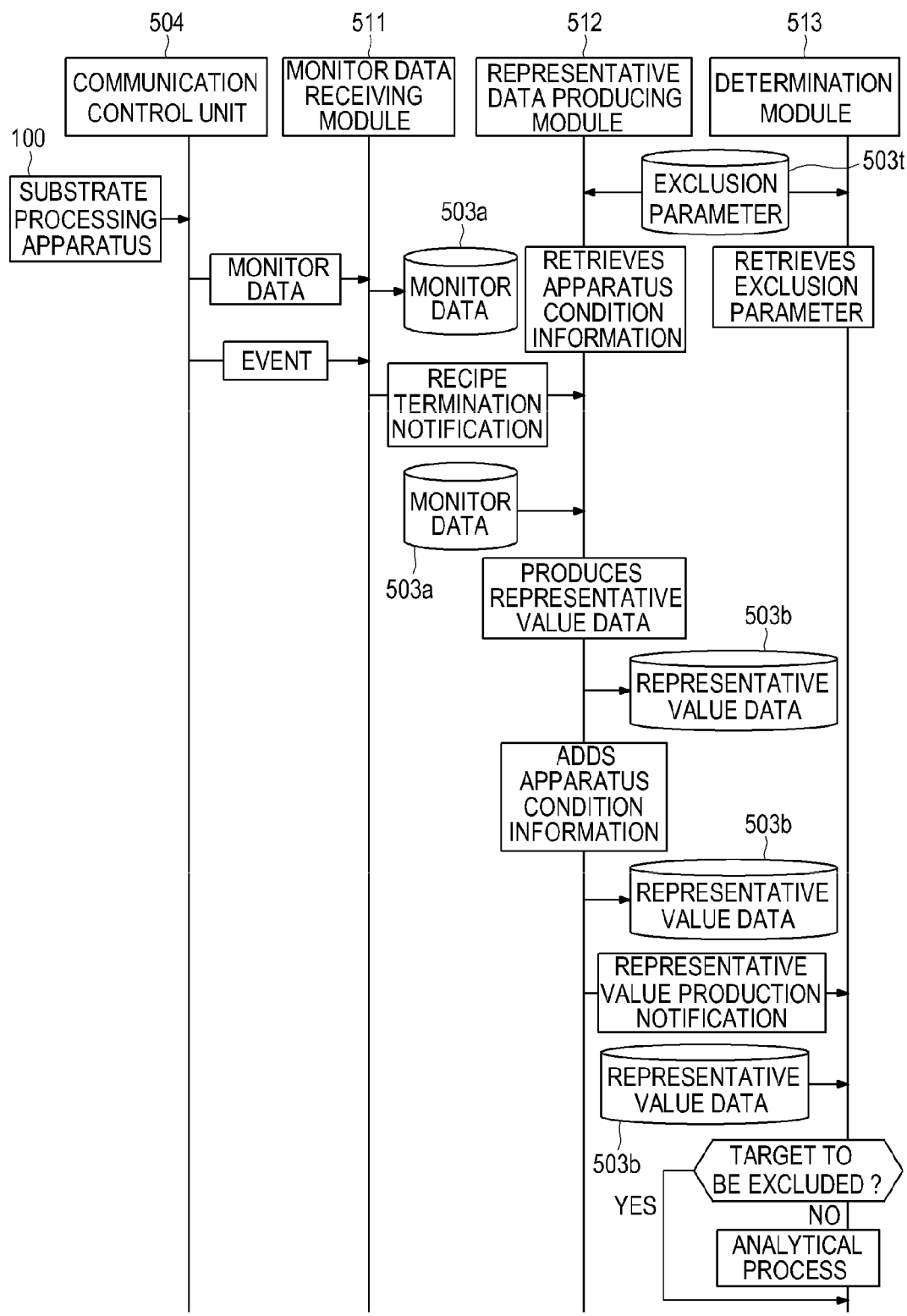
FIG. 3 is a state diagram showing the internal operation flow of the group managing apparatus according to one embodiment of the present disclosure.

The following is a description, with reference to FIGS. 2 to 4, of a configuration of the group managing apparatus 500 according to an embodiment of the present disclosure, which is connected to the substrate processing apparatus 100 to exchange data.

FIG. 2 is a block diagram showing configurations of the substrate processing apparatus and the group managing apparatus according to the present disclosure. FIG. 3 is a state diagram showing the internal operation flow of the group managing apparatus according to the present disclosure. FIG. 4 is a table showing exclusion parameters associated with apparatus condition information according to the present disclosure.

As shown in FIG. 2, the group managing apparatus 500 may be implemented as a computer which includes a control unit 501 used as a central processing unit (CPU), a memory (not shown) including a shared memory area 502 therein, a storage unit 503 used as a memory device such as a hard disk drive (HDD), a data display unit 505 used as a display means, an input means 506 such as a keyboard, and a communication control unit 504 used as a communication unit. The memory, the storage unit 503, the data display unit 505, the input means 506 and the communication control unit 504 as described above are connected to exchange data with the control unit 501 through, for example, an internal bus.

(Communication Control Unit)

The communication control unit 504 used as the communication unit is connected to the communication control unit 239b of the controller 240 through the network 400 and may also be connected to the I/O control unit (including the gas flow rate controlling unit 235, the pressure control part 236, and the temperature control part 237) and the carry control unit 238. The communication control unit 504 is configured to receive the monitor data provided from the substrate processing apparatus 100 and transmit the received monitor data to the shared memory area 502. The monitor data transmitted to the shared memory area 502 may include a data ID for identifying the monitor data, data time information representative of a time at which the monitor data is generated, production information data or the like. The production information data may include: apparatus identification information (e.g., a model number) for identifying the substrate processing apparatus 100 employed as a source of generating the monitor data; recipe identification information for identifying a recipe that is being performed by the substrate processing apparatus 100 at the time of production of the monitor data; process identification information for identifying a substrate process that is being performed by the substrate processing apparatus 100 at the time of generating the monitor data; information for identifying a thin film value or a position to which the wafer 200 is transferred; or the like.

(Storage Unit)

The storage unit 503 stores therein a first stored program, a second stored program, a determination program and a database program. The control unit 501 includes at least a monitor data receiving module 511, a representative value data producing module 512, and a determination module 513. The control unit 501 is configured to execute programs stored in the storage unit 503 to produce representative value data (to be used for analysis process) from the monitor data provided from the substrate processing apparatus 100. Specifically, the control unit 501 is configured to read and transfer the first storage program from the storage unit 503 to the memory (not shown), and execute the first storage program to implement the monitor data receiving module 511 in the group managing apparatus 500, which will be described later. Further, the control unit 501 is configured to read and transfer the second storage program from the storage unit 503 to the memory (not shown), and execute the second storage program to implement the representative value producing module 512 in the group managing apparatus 500, which will be described later. Further, the control unit 501 is configured to read and transfer the determination program from the storage unit 503 to the memory (not shown), and execute the determination program to implement the determination module 513 in the group managing apparatus 500, which will be described later. Further, the control unit 501 is configured to read and transfer the database program from the storage unit 503 to the memory (not shown), and execute the database program to implement a database 503a used as a first storing unit adapted to read and store the monitor data, and a database 503b used as a second storing unit adapted to read and store the representative value, respectively, in the storage unit 503, which will be described later. The storage unit 503 further stores exclusion parameter 503t including information indicating whether or not representative value data associated with respective conditions of the substrate processing apparatus 100 should be included in an analysis processing target.

(Exclusion Parameter)

As shown in FIG. 4, a plurality of "apparatus condition information" associated with the substrate processing apparatus 100 is registered in the exclusion parameter 503t. The "apparatus condition information" registered in the exclusion parameter 503t refers to information indicating respective conditions of the substrate processing apparatus 100 that may be excluded from analysis processing targets (or statistical analysis targets). For example, typically, a process in which the $NF_3$ gas (used as the clean gas) is supplied from the gas supply system to the inside of the process chamber 201 is not performed during execution of a production recipe. For this reason, a condition where "a valve mounted in the gas supply system for supplying the $NF_3$ gas is opened at least once during execution of the recipe" is registered as one condition to be excluded from the analysis processing targets (i.e., one condition to be preferably excluded from the analysis processing targets) in the "apparatus condition information" of the exclusion parameter 503t. In addition, other conditions where "a pump power supply is turned off," "a temperature of a particular jacket heater is equal to or less than 100 degrees," "a temperature inside a furnace is lower than the temperature set in a standby mode," "the number of product wafers is zero," "a received monitor data value is twice or greater than a representative data value produced previously," "a maintenance button provided in the substrate processing apparatus is pushed down," "an alarm is generated from a specific apparatus" or the like, may be registered as conditions to be excluded from the analysis process targets (i.e., conditions to be excluded from the analysis processing targets) in the "apparatus condition information" of the exclusion parameter 503t.

"Exclusion operation" registered in the exclusion parameter 503t represent information defining whether or not the monitor data (or representative value data produced based on the monitor data) provided from the substrate processing apparatus 100 should be included in the analysis processing targets in association with the respective "apparatus condition information" as described above. If the "exclusion operation" indicates "do not analyze," the determination module 513 determines that the corresponding monitor data are excluded from the analysis processing targets. On the other hand, if the "exclusion operation" indicates "analyze," the determination module 513 determines that the corresponding monitor data are included in the analysis processing targets. In this way, in accordance with this embodiment, the combination of the items "apparatus condition information" and "exclusion operation" provide criteria for determining whether or not the received monitor data (or the representative value produced based on the received monitor data) should be included in the analysis processing targets.

Further, when the second storing program is executed, "apparatus condition information" registered in the exclusion parameter 503t is read and transferred to a memory area under the control of the second storing program, which allows the representative value producing module 512 to retrieve the above information stored in the memory area as needed. In addition, when the determination program is executed, "apparatus condition information" and "exclusion operation" items registered in the exclusion parameter 503t are read and transferred to a memory area under the control of the determination program, which allows the determination module 513 to retrieve the above information items stored in the memory area as needed.

(Monitor Data Receiving Module)

The monitor data receiving module 511 is configured to associate the monitor data (which is provided from the substrate processing apparatus 100 through the communication control unit 504 and is temporarily stored in the shared memory area 502) with the data ID, the data time information and the production information data as described above, and store the data associated with the above information in the database 503a (used as the first storing unit) implemented in the storage unit 503. Further, the monitor data receiving module 511 is configured to analyze the monitor data provided from the substrate processing apparatus 100 through the communication control unit 504, thereby interpreting the contents of various events occurring in the substrate processing apparatus 100. When the interpretation result indicates that the execution of a recipe by the substrate processing apparatus 100 is terminated, the monitor data receiving module 511 transmits a "recipe termination notification" to the representative value producing module 512. The communication between the monitor data receiving module 511 and the representative value producing module 512 may be conducted, for example, through the shared memory area 502. Specifically, the communication may be performed in such a manner that the monitor data receiving module 511 writes the "recipe termination notification" in the shared memory area 502, from which the representative value producing module 512 reads the above notification at a predetermined time.

(Representative Value Producing Module)

Upon receiving the "recipe termination notification" from the monitor data receiving module 511, the representative value producing module 512 retrieves the monitor data stored by the monitor data receiving module 511 from the database 503a (used as the first storing unit), and produces a representative value data based on the retrieved monitor data. The representative value data may include, for example, "representative value name" information indicative of the name of the representative value, "representative value extraction condition" information indicative of conditions (e.g., an average, a maximum, a minimum, a standard variation, etc.) for calculating the representative value, "representative value extraction step" information indicative of a step (e.g., a step number 10, a step DEPO or the like) during which the representative value is extracted, "representative value extraction time" information indicative of dates/times at which the representative value extraction actually starts and ends, "representative value" information indicative of the representative value itself, "representative value production date/time" indicative of date/time at which the representative value is produced, "representative value calculation time" information indicative of a time required for calculating the representative value, "number of data points" information indicative of the number of data points used in calculating the representative value, or the like. Further, the representative value producing module 512 is configured to store the above produced representative value data in the database 503b (used as the second storing unit) implemented in the storage unit 503 to be retrieve for further processing.

Further, the representative value producing module 512 is configured to analyze the monitor data (i.e., the monitor data used in producing the representative value data as described above) retrieved from the database 503a, and determine whether a condition of the substrate processing apparatus 100 at the time of production of the monitor data matches any one of the conditions specified by the "apparatus condition information" registered in the exclusion parameter 503t (in an exclusion pattern matching operation). In this matching operation, it may be determined that the condition of the substrate processing apparatus 100 at the time of production of the monitor data matches any one of the conditions specified by the "apparatus condition information" registered in the exclusion parameter 503*t*, including, for example, "the valve mounted in the gas supply system for supplying the $NF_3$ gas is opened at least once during execution of the recipe," "the pump power supply is turned off," "a temperature of a jacket heater is equal to or less than 100 degrees," "the temperature inside a furnace is lower than the temperature set in a standby mode," "the number of product wafers is zero," "a received monitor data value is twice or greater than a representative data value produced previously," "a maintenance button provided in the substrate processing apparatus is pushed down," or "an alarm is generated from a specific apparatus." In this case, the representative value producing module 512 associates the "apparatus condition information" corresponding to the matched condition with the representative value data and stores the apparatus condition information in the database 503*b* to be retrieved for further processing. As described above, the representative value producing module 512 may retrieve the "apparatus condition information" stored in the exclusion parameter 503*t* as needed.

If the operation of storing the representative value data in the database 503*b* and the exclusion pattern matching operation are completed, the representative value producing module 512 transmits a "representative value production notification" to the determination module 513. The communication between the representative value producing module 512 and the determination module 513 may be performed, for example, through the shared memory area 502. In particular, the communication may be performed in such a manner that the representative value producing module 512 writes the "representative value production notification" in the shared memory area 502, from which the determination module 513 reads the above notification at a predetermined time.

(Determination Module)

Upon receiving the "representative value production notification" from the representative value producing module 512, the determination module 513 retrieves the representative value data and the "apparatus condition information" associated with the representative value data (stored by the representative value producing module 512) from the database 503*a*.

Then, the determination module 513 compares the information defined in the exclusion parameter 503*t* with the "apparatus condition information" associated with the representative value data and determines whether or not the retrieved representative value data should be included in the analysis processing targets. Specifically, the determination module 513 reads an "exclusion operation" corresponding to the "apparatus condition information" (associated with the retrieved representative value data) out of the exclusion parameter 503*t*. When the read "exclusion operation" indicates "do not analyze," the determination module 513 determines that the representative value data retrieved from the database 503*b* should be excluded from the analysis processing targets. On the other hand, when the read "exclusion operation" indicates "analyze," the determination module 513 determines that the representative value data retrieved from the database 503*b* should be included in the analysis processing targets. Thereafter, the determination module 513 performs the analysis process only on the representative value data, which are determined to be included in the analysis processing targets.

Further, when the determination module 513 retrieves the last produced representative value data from the database 503*b* upon receiving the "representative value production notification," the determination module 513 also retrieves other representative value data, which are previously produced under the same condition (hereinafter referred to as "previous representative value data"), from the database 503*b*. Thereafter, the determination module 513 determines whether each of the previous representative value data should be included in the analysis processing targets. Thus, only the previous representative value data that are determined to be included in the analysis processing targets are added to population parameters. This improves the quality of the population parameters, thus enhancing the accuracy of the statistical processing.

In some embodiments, the determination module 513 may be configured to associate the determination results (indicating whether the previous representative value data should be included in the analysis processing targets) with the representative value data, and store them in the database 503*b*. With this arrangement, the determination results (indicating whether the previous representative value data should be included in the analysis processing targets) may be reusable for later analysis processing. Furthermore, this eliminates the need for repetitively performing the operation of determining whether the previous representative value data should be included in the analysis processing targets, thus improving the efficiency of the analysis.

Even if the representative value data are determined to be excluded from the analysis processing targets, the determination module 513 may maintain the same data in the database 503*b* without discarding them. The criteria for determining whether or not the representative value data should be included in the analysis processing targets, may be changed by rewriting the contents of the "exclusion operation" item registered in the exclusion parameter 503*t* while the representative value data are held in the database 503*b*. Depending on the change of the criteria, the determination module 513 may determine to include the representative value data, which were initially determined to be excluded from the analysis processing targets, in the analysis processing targets.

(8) Operation of Group Managing Apparatus

In the following, a description will be made as to the operation of the group managing apparatus 500 according to one embodiment of the present disclosure with reference to FIG. 3. The operation may be performed as a part of the process of manufacturing a semiconductor device.

The control unit 501 reads and transfers the first storage program, the second storage program, the determination program and the database program stored in the storage unit 503 to the memory (not shown) as described above, so that the monitor data receiving module 511, the representative value producing module 512, the determination module 513 and the database 503*a* are executed.

The communication control unit 504 of the group managing apparatus 500 receives the monitor data provided from the substrate processing apparatus 100 and stores the same data in the shared memory area 502.

The monitor data receiving module 511 retrieves the monitor data stored (by the communication control unit 504) in the shared memory area 502 to store the same data in the database 503*a*, which is implemented in the storage unit 503, for further processing. Further, the monitor data receiving module 511 analyzes the monitor data received from the substrate processing apparatus 100 through the communication control unit 504 and interprets contents of various events occurring in the substrate processing apparatus 100. If the interpretation result indicates that the execution of a recipe by the substrate processing apparatus 100 is terminated, the monitor data receiving module 511 transmits a "recipe termination notification" to the representative value producing module 512.

The representative value producing module 512 retrieves the monitor data stored (by the monitor data receiving module 511) in the database 503a, and produces representative value data based on the retrieved monitor data. Then, the representative value producing module 512 stores the produced representative value data in the database 503b (used as the second storing unit) implemented in the storage unit 503 for further processing.

Further, the representative value producing module 512 analyzes the monitor data (i.e., the monitor data used in producing the representative value data as described above) retrieved from the database 503a, and determines whether a condition of the substrate processing apparatus 100 at the time of production of the monitor data matches any one of the conditions specified by the "apparatus condition information" registered in the exclusion parameter 503t (in the exclusion pattern matching operation). When the condition of the substrate processing apparatus 100 at the time of production of the monitor data matches any one of the conditions specified by the "apparatus condition information" registered in the exclusion parameter 503t, the representative value producing module 512 associates the corresponding "apparatus condition information" with the representative value data and stores the same information in the database 503b. Thereafter, the representative value producing module 512 transmits the "representative value production notification" to the determination module 513.

The determination module 513 retrieves the representative value data stored by the representative value producing module 512 and the "apparatus condition information" associated with the representative value data, from the database 503b. Then, the determination module 513 compares the information registered in the exclusion parameter 503t with the "apparatus condition information" associated with the representative value data, and determines whether the retrieved representative value data should be included in the analysis processing targets. Specifically, the determination module 513 retrieves an "exclusion operation" corresponding to the "apparatus condition information" from the exclusion parameter 503t. If the retrieved "exclusion operation" indicates "do not analyze," the determination module 513 determines that the representative value data retrieved from the database 503a should be excluded from the analysis processing targets. On the other hand, if the retrieved "exclusion operation" indicates "analyze," the determination module 513 determines that the representative value data retrieved from the database 503b should be included in the analysis processing targets.

Then, only the representative value data, which are determined to be included in the analysis processing targets, are subjected to the analysis process.

(9) Effects According to Embodiments of Present Disclosure

The embodiments as described above may have one or more of the following effects:

(a) The representative value producing module 512 according to the above embodiments analyzes the monitor data (i.e., the monitor data used in producing the representative value data) retrieved from the database 503a, and determines whether a condition of the substrate processing apparatus 100 at the time of production of the monitor data matches any one of the conditions specified by the "apparatus condition information" registered in the exclusion parameter 503t. When the condition of the substrate processing apparatus 100 at the time of production of the monitor data matches any one of the conditions specified by the "apparatus condition information" registered in the exclusion parameter 503t, the representative value producing module 512 associates the corresponding "apparatus condition information" with the representative value data and stores the same information in the database 503b. Further, the determination module 513 according to the present disclosure retrieves the representative value data stored by the representative value producing module 512 and the "apparatus condition information" associated with the representative value data, from the database 503b. Then, the determination module 513 compares the information registered in the exclusion parameter 503t with the "apparatus condition information" associated with the representative value, and determines whether the retrieved representative value data should be included in the analysis processing targets.

Therefore, the analyze process may be performed only on the representative value data, which are determined to be included in the analysis processing targets. Further, the determination module 513 may exclude representative value data (i.e., monitor data) that are produced during a period of time (or a processing step) when the substrate processing apparatus 100 is not subject to the analysis processing, from the statistical analysis targets, thus enhancing the accuracy of statistical analysis.

Further, the group managing apparatus 500 is configured to automatically perform a process of determining whether or not the representative value data should be included in the analysis processing targets, which significantly reduces operator-hours required for the statistical analysis. For example, this eliminates some operator's work required during test runs or maintenance operations, including suspending a monitor data collecting function or a statistical analysis function, which will be performed in the group managing apparatus 500 for the test runs or maintenance operations (b) Further, upon receiving the "representative value production notification," the determination module 513 according to one embodiment of the present disclosure is configured to retrieve last produced representative value data from the database 503b and also retrieve previous representative value data that are previously produced under the same condition. Further, the determination module 513 determines whether each of the retrieved previous representative value data should be included in the analysis processing targets. By doing this, only the previous representative value data that are determined to be included in the analysis processing targets are added to population parameters. This improves the quality of the population parameters, thus enhancing the accuracy of statistical analysis.

(c) Further, the determination module 513 according to the above embodiments is configured to associate the determination result indicative of whether the retrieved representative value data should be included in the analysis processing targets, with the representative value data, and stores them in the database 503b. With this configuration, the determination result indicative of whether the retrieved representative value data should be included in the analysis processing targets is reusable for further processing. Furthermore, this eliminates the need for repeatedly performing the operation of determining whether the previous representative value data should be included in the analysis processing targets, thus improving the efficiency of the analysis.

(d) In the above embodiments, the criteria for determining whether the received monitor data (i.e., representative value data produced based on the received monitor data) are included in the analysis processing targets, is determined based on the "apparatus condition information" as well as the corresponding "exclusion operation." Thus, the criteria may be easily changed or adjusted by merely changing the "exclusion operation" item into either one of "analyze" and "do not analyze," while leaving the "apparatus condition information" unchanged in the exclusion parameter 503t. This reduces the burden of a field worker who conducts the management of the substrate processing apparatus 100 or the burden of an operator who performs the statistical analysis.

(e) Even if the representative value data are determined to be excluded from the analysis processing targets, the determination module 513 according to the above embodiments may hold those representative value data in the database 503b without discarding them. In the meantime, the criteria for determining whether the representative value data are included in the analysis processing targets, may be changed by changing the "exclusion operation" item registered in the exclusion parameter 503t while holding the representative value data in the database 503b. Thus, depending on the change of the criteria, the determination module 513 may include the representative value data that were initially determined to be excluded from the analysis processing targets, in the analysis processing targets. For example, while the monitor data received from the substrate processing apparatus 100, indicating that the temperature of a particular jacket heater is equal to or less than 100 degrees, are not included in the analysis processing targets (as shown in FIG. 4), the determination module 513 may hold the same representative value data (that are not included in the analysis processing targets) in the database 503b without discarding them. Therefore, by changing the "exclusion operation" item registered in the exclusion parameter 503t (i.e., an operation associated with the condition of the temperature of the jacket heater) from "do not analyze" to "analyze," the representative value data can be included in the analysis processing targets.

<Additional Embodiments of Present Disclosure>

The present disclosure is not limited to the configuration in which the substrate processing apparatus 100 and the group managing apparatus 500 are disposed on the same floor (e.g., in the same clean room). For example, in some embodiments, the substrate processing apparatus 100 may be disposed inside the clean room, while the group managing apparatus 500 may be disposed in an office (e.g., on a different floor from the floor where the clean room is located) so that the progress of execution of a recipe or a condition of the substrate processing apparatus 100 can be monitored remotely.

The present disclosure may be applicable to other substrate processes including diffusion, annealing, oxidation, nitridation or lithography, in addition to a film formation process using on CVD (Chemical Vapor Deposition), ALD (Atomic Layer Deposition) and PVD (Physical Vapor Deposition). Further, the present disclosure may be applicable to other substrate processing apparatuses including an annealing apparatus, an oxidation apparatus, a nitridation apparatus, an exposure apparatus, a coating apparatus, a drying apparatus, and a heating apparatus or the like, in addition to the thin-film formation apparatus.

The present disclosure is not limited to the substrate processing apparatus, for example, a semiconductor manufacturing apparatus, which processes a wafer substrate. For example, the present disclosure is also applicable to a substrate processing apparatus which processes a glass substrate, such as a LCD (Liquid Crystal Display) manufacturing apparatus.

<Aspects of Present Disclosure>

Hereinafter, additional aspects of the present disclosure will be described.

A first aspect of the present disclosure may provide a data analyzing method for performing an analysis process on monitor data stored in a database, the monitor data received from a substrate processing apparatus configured to process a substrate, the method including: receiving monitor data from the substrate processing apparatus; producing representative value data based on the monitor data; associating apparatus condition information indicating a condition of the substrate processing apparatus at the time of production of the monitor data, with the representative value data; storing the representative value data and the apparatus condition information associated with the representative value data in a database; retrieving the representative value data and the apparatus condition information associated with the representative value data from the database; comparing an exclusion parameter with the retrieved apparatus condition information, the exclusion parameter including information indicating whether the retrieved representative value data should be included in analysis processing targets; and determining whether the retrieved representative value data should be included in the analysis processing targets, based on the comparison result.

The method according to the first aspect may further include associating the determination result indicating whether the retrieved representative value data should be included in the analysis processing targets, with the representative value data, and storing the determination result associated with the representative value data in the database.

A second aspect of the present disclosure may provide a substrate processing system including: a substrate processing apparatus configured to process a substrate; and a group managing apparatus configured to communicate with the substrate processing apparatus, wherein the group managing apparatus includes: a communication unit configured to receive monitor data from the substrate processing apparatus; a monitor data receiving module configured to receive the monitor data from the communication unit and further configured to store the received monitor data in a storing unit; a representative value producing module configured to retrieve the monitor data stored in the storing unit, produce representative value data based on the monitor data, associate apparatus condition information indicating a condition of the substrate processing apparatus at the time of production of the monitor data, with the representative value data, and store the representative value data and the apparatus condition information associated with the representative value data in the storing unit; and a determination module configured to retrieve the representative value data and the apparatus condition information associated with the representative value data stored in the storing unit, compare an exclusion parameter including information indicating whether the retrieved representative value data should be included in analysis processing targets, with the retrieved apparatus condition information, and determine whether the retrieved representative value data should be included in the analysis processing targets, based on the comparison result.

In the system according to the second aspect, the determination module may be further configured to associate the determination result indicating whether the retrieved representative value data should be included in the analysis processing targets, with the representative value data, and store the determination result associated with the representative value data in the storing unit.

A third aspect of the present disclosure may provide a group managing apparatus configured to communicate with a substrate processing apparatus configured to process a substrate, the group managing apparatus comprising: a communication unit configured to receive monitor data from the substrate processing apparatus; a monitor data receiving module configured to receive the monitor data from the communication unit and further configured to store the received monitor data in a storing unit; a representative value producing module configured to retrieve the monitor data stored in the storing unit, produce representative value data based on the monitor data, associate apparatus condition information indicating a condition of the substrate processing apparatus at the time of production of the monitor data, with the representative value data, and store the representative value data and the apparatus condition information associated with the representative value data in the storing unit; and a determination module configured to retrieve the representative value data and the apparatus condition information associated with the representative value data stored in the storing unit, compare an exclusion parameter including information indicating whether the retrieved representative value data should be included in analysis processing targets, with the retrieved apparatus condition information, and determine whether the retrieved representative value data should be included in the analysis processing targets, based on the comparison result.

In the group managing apparatus according to the third aspect, the determination module may be further configured to associate the determination result indicating whether the retrieved representative value data should be included in the analysis processing targets, with the representative value data, and store the determination result associated with the representative value data in the storing unit.

According to the above embodiments of the present disclosure, it is possible to exclude monitor data that are produced during a time period (or a processing step) when a substrate processing apparatus is not subject to the analysis processing, from statistical analysis targets, thereby enhancing the accuracy of statistical analysis.

While certain embodiments have been described, these embodiments have been presented by way of example only, and are not intended to limit the scope of the disclosures. Indeed, the novel embodiments described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A statistical analysis method for performing an analysis process on monitor data stored in a database, the monitor data received from a substrate processing apparatus configured to process a substrate, the method comprising:
   receiving monitor data from the substrate processing apparatus;
   producing representative value data based on the monitor data;
   associating the representative value data with apparatus condition information indicating a condition of the substrate processing apparatus at a time of production of the monitor data;
   storing the representative value data and the apparatus condition information associated with the representative value data in the database;
   retrieving the representative value data and the apparatus condition information associated with the representative value data from the database;
   comparing an exclusion parameter with the retrieved apparatus condition information, the exclusion parameter including information indicating whether the representative value data associated with the apparatus condition information should be included in statistical analysis targets; and
   determining whether the retrieved representative value data are included in the statistical analysis targets, based on a comparison result produced by comparing the exclusion parameter with the apparatus condition information;
   wherein when the information included in the exclusion parameter is changed, determining whether to include additional representative value data in the statistical analysis targets.

2. A substrate processing system, comprising:
   a substrate processing apparatus configured to process a substrate; and
   a group managing apparatus configured to communicate with the substrate processing apparatus, the group managing apparatus including:
      a communication unit configured to receive monitor data from the substrate processing apparatus;
      a monitor data receiving module configured to:
         receive the monitor data from the communication unit; and
         store the received monitor data in a storing unit;
      a representative value producing module configured to:
         retrieve the monitor data stored in the storing unit,
         produce representative value data based on the monitor data,
         associate the representative value data with apparatus condition information indicating a condition of the substrate processing apparatus at a time of production of the monitor data, and
         store the representative value data and the apparatus condition information associated with the representative value data in the storing unit; and
      a determination module configured to:
         retrieve the representative value data and the apparatus condition information associated with the representative value data stored in the storing unit,
         compare an exclusion parameter with the retrieved apparatus condition information, the exclusion parameter including information indicating whether representative value data associated with the apparatus condition information should be included in statistical analysis targets, and
         determine whether the retrieved representative value data are included in the statistical analysis targets, based on a comparison result produced by comparing the exclusion parameter with the apparatus condition information;
   wherein when the information included in the exclusion parameter is changed, determining whether to include additional representative value data in the statistical analysis targets.

3. The system of claim 2, wherein the determination module is further configured to:
   associate a determination result indicating whether the retrieved representative value data are included in the statistical analysis targets, based on the comparison result, with the representative value data, and
   store the determination result associated with the representative value data in the storing unit.

4. A group managing apparatus configured to communicate with a substrate processing apparatus configured to process a substrate, the group managing apparatus comprising:
   a communication unit configured to receive monitor data from the substrate processing apparatus;
   a monitor data receiving module configured to:
      receive the monitor data from the communication unit; and
      store the received monitor data in a storing unit;

a representative value producing module configured to:
    retrieve the monitor data stored in the storing unit,
    produce representative value data based on the monitor data,
    associate the representative value data with apparatus condition information indicating a condition of the substrate processing apparatus at a time of production of the monitor data, and
    store the representative value data and the apparatus condition information associated with the representative value data in the storing unit; and
a determination unit configured to:
    retrieve the representative value data and the apparatus condition information associated with the representative value data stored in the storing unit,
    compare an exclusion parameter with the retrieved apparatus condition information, the exclusion parameter including information indicating whether representative value data associated with the apparatus condition information should be included in statistical analysis targets, and
    determine whether the retrieved representative value data are included in the statistical analysis targets, based on a comparison result produced by comparing the exclusion parameter with the apparatus condition information;
    wherein when the information included in the exclusion parameter is changed, determining whether to include additional representative value data in the statistical analysis targets.

5. The apparatus of claim 4, wherein the determination unit is further configured to
    associate a determination result indicating whether the retrieved representative value data are included in the statistical analysis targets, based on the comparison result, with the representative value data, and
    store the determination result associated with the representative value data in the storing unit.

6. A non-transitory computer-readable recording medium storing a program that, when executed in a group management apparatus connected to a substrate processing apparatus configured to process a substrate, causes a computer to perform a process of:
    storing monitor data received from the substrate processing apparatus in a computer-readable storing unit;
    producing representative value data based on the monitor data:
    associating the representative value data with apparatus condition information indicating a condition of the substrate processing apparatus at a time when the monitor data is produced;
    storing the representative value data and the apparatus condition information associated with the representative value data in the computer-readable storing unit;
    retrieving the representative value data and the apparatus condition information associated with the representative value data from the computer-readable storing unit; and
    determining whether the retrieved representative value data should be included in statistical analysis targets by comparing an exclusion parameter with the retrieved apparatus condition information, the exclusion parameter including predetermined information indicating whether the retrieved representative value data associated with the apparatus condition information should be included in the statistical analysis targets;
    wherein when the information included in the exclusion parameter is changed, determining whether to include additional representative value data in the statistical analysis targets.

* * * * *